US005609773A

United States Patent [19]
Usui et al.

[11] Patent Number: 5,609,773
[45] Date of Patent: Mar. 11, 1997

[54] METHOD FOR MANUFACTURE OF MULTILAYER WIRING BOARD AND THE MULTILAYER WIRING BOARD

[75] Inventors: Mitsuru Usui; Tetsuya Watanabe, both of Hadano, Japan

[73] Assignee: Hitachi, Ltd., Japan

[21] Appl. No.: 332,134

[22] Filed: Oct. 31, 1994

[30] Foreign Application Priority Data

Nov. 1, 1993 [JP] Japan ................................. 5-273729

[51] Int. Cl.⁶ ............................................. H05K 3/00
[52] U.S. Cl. ................................ 216/20; 216/18; 216/16; 216/95; 216/100
[58] Field of Search ............................. 216/18, 13, 16, 216/20, 95, 100, 102–104, 108, 109

[56] References Cited

U.S. PATENT DOCUMENTS

| | | | |
|---|---|---|---|
| 4,226,932 | 10/1980 | Ferraris | 216/16 |
| 4,451,554 | 5/1984 | Kishi et al. | 216/108 X |
| 5,192,716 | 3/1993 | Jacobs | 437/209 |
| 5,227,012 | 7/1993 | Brandli et al. | 216/16 |
| 5,256,247 | 10/1993 | Watanabe et al. | 216/104 X |

FOREIGN PATENT DOCUMENTS 60-10755  1/1985  Japan .

*Primary Examiner*—Thi Dang
*Attorney, Agent, or Firm*—Evenson, McKeown, Edwards & Lenahan, P.L.L.C.

[57] ABSTRACT

In a multilayer wiring board comprising a substrate on which two or more layers of wiring or insulation film are formed of different materials, for example, the wiring layer is processed so that the processed side faces of the board contour a stepped shape in the cross-sectional view of the board, whereby coverage of a film formed thereon can be improved. Specifically, first, insulation film 2 is formed on a substrate 1 and then, resistor film 3 and resistor electrode film 4 are continuously formed thereon to form a film of multiple structure. Mask 9 is formed thereon. Then, the layers is etched successively in the order of from the top layer and thereafter only the resistor electrode film 4 is further etched with an etching solution which selectively etches only the resistor electrode film 4 to form a stepwise patterned side face. Finally, the mask is removed and wiring electrode film 5 is formed.

2 Claims, 3 Drawing Sheets

FIG. 1
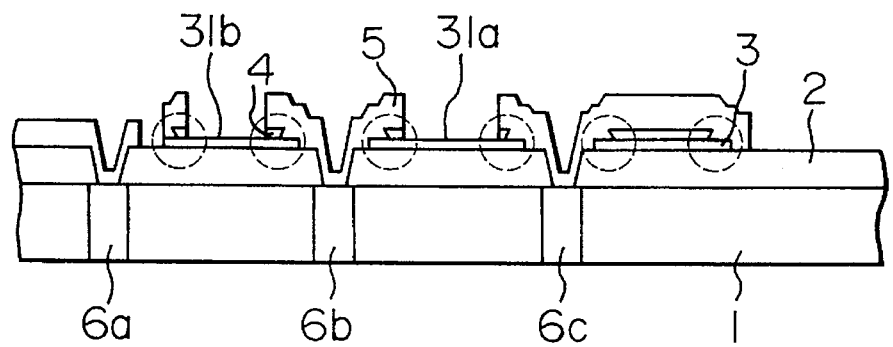
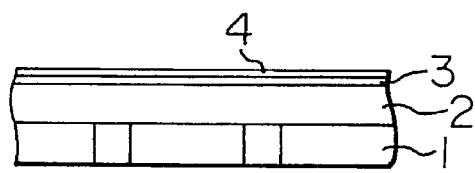
FIG. 2a
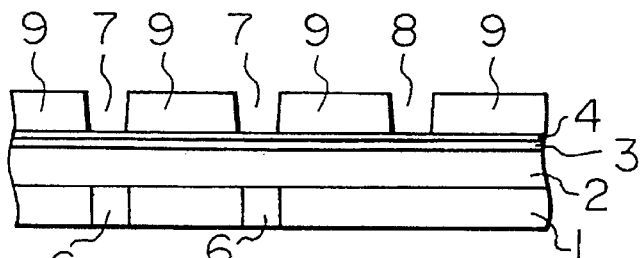
FIG. 2b
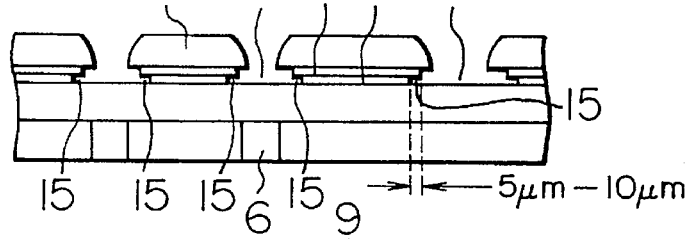
FIG. 2c
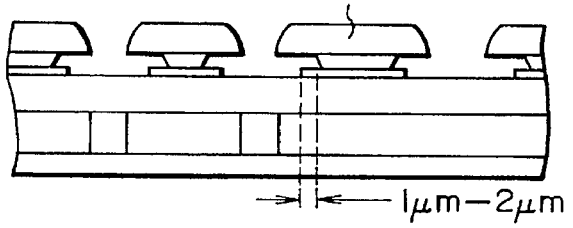
FIG. 2d
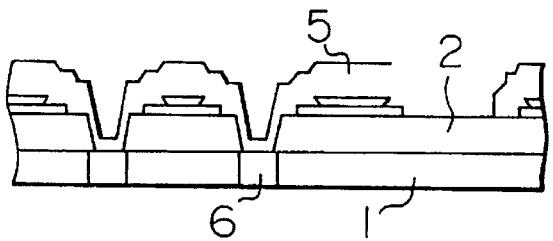
FIG. 2e F I G. 3
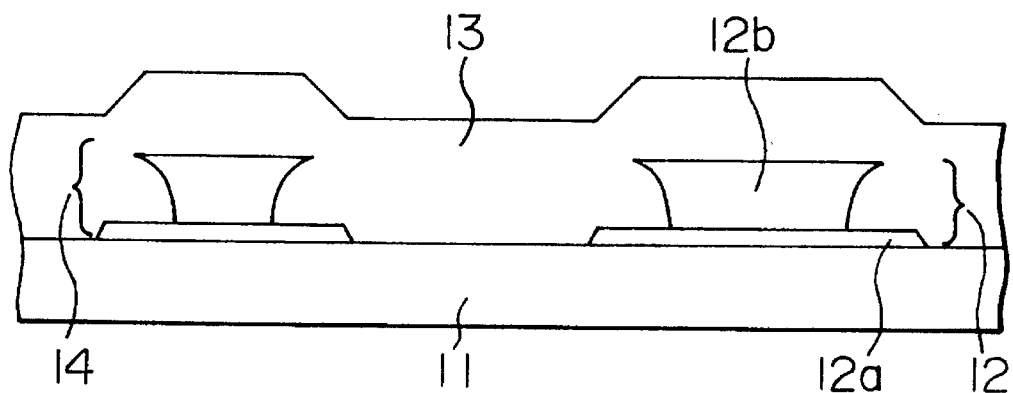

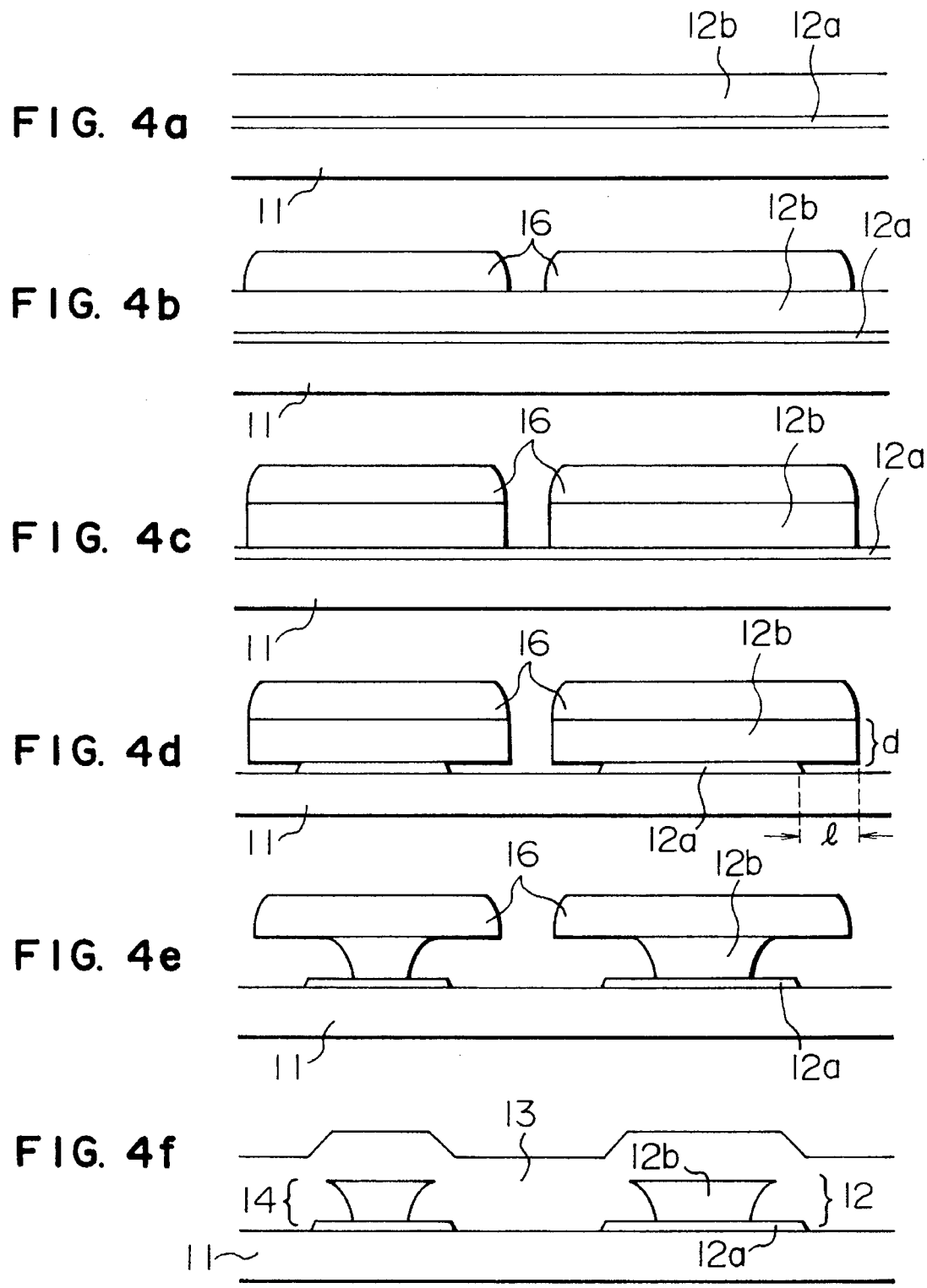

METHOD FOR MANUFACTURE OF MULTILAYER WIRING BOARD AND THE MULTILAYER WIRING BOARD

BACKGROUND OF THE INVENTION

The present invention relates to a method for manufacture of multilayer wiring boards and to the resulting multilayer wiring boards, and more particularly to a method for manufacture of multilayer wiring boards comprising a substrate and a wiring pattern, a resistor film pattern or an insulator film pattern formed on the substrate by laminating two or more layers of different materials and to the resulting multilayer wiring boards.

In general, as multilayer wiring boards on which electronic components are to be mounted in high density, there are used multilayer wiring boards prepared by forming a thin film multilayer wiring comprising an organic insulating film and a metal wiring pattern on a substrate. In the multilayer wiring boards of this type, a main conductor layer (metal wiring pattern) and an antioxidation protective layer are successively formed to prevent oxidation of the surface of the metal wiring pattern. Therefore, the wiring pattern has a multiple structure comprising the conductor layer and the antioxidation protective layer which are laminated. Furthermore, in such multilayer wiring boards, for the purpose of flattening of the boards the insulating layer is constructed of a plurality of different insulating films in a laminated form.

Hitherto, processing of wiring materials and insulating films of such a multilayer structure has been carried out by etching the respective laminated layers successively or the two or more layers simultaneously from the upper layer side in accordance with photoetching or the like to form a pattern. Alternatively, the pattern can be formed by repeating the photoetching by the number of times corresponding to the number of the wiring materials, the resistor materials and the insulating materials.

A prior art on the multilayer wiring boards of this type is disclosed, for example, in JP 60-10755A.

In the technique of the prior art above, when the wiring materials, resistor materials and insulating materials of multilayer structure are subjected to etching, the etching is carried out successively in the order of from the top layer to the lower layers and, therefore, the under-etching of the upper layers occurs when the lower layer is etched. When a film of a wiring material is further formed over the formed wiring pattern of a multilayer structure, the film of the wiring material cannot be sufficiently formed at the under-etched portion to cause decrease of coverage. Moreover, in order to prevent occurrence of the under-etching in the prior technique, a plurality of patterning steps of a mask material are needed and a plurality of photoetching steps are needed. Thus, the number of processing steps increases undesirably.

SUMMARY OF THE INVENTION

It is an object of the present invention to provide a method for making multilayer wiring boards which solves the problems of the prior art, according to which method a wiring material layer, a resistor material layer and an insulating material layer of a multilayer structure can be processed in the stepped form at the ends in a cross-sectional view thereof by only one step for formation of a mask.

It is another object of the present invention to provide a method for making multilayer wiring boards, according to which method a wiring material layer, a resistor material layer and an insulating material layer of a multilayer structure can be processed in the reversely tapered form in the cross-sectional view thereof by only one step of formation of a mask.

A further object of the present invention is to provide a method for making multilayer wiring boards, according to which method the desired cross-sectional contour can be obtained through a small number of steps by using in combination the method of processing in the stepped form and the method of processing in the reversely tapered form.

The object of the present invention can be attained in the following manner. That is, the pattern of the wiring or insulating layer of multilayer structure is formed by once making a pattern on the mask, followed by taking some successive steps of etching the layers of the multilayer structure: firstly etching the top layer and then the successively lower layer, and then the second layer from the bottom layer and then the top layer with etching mediums which selectively etch the layers, and finally removing the mask.

The another object of the present invention mentioned above can be attained in the following manner. That is, the pattern of the wiring or insulating layer of a multilayer structure is formed by once patterning the mask, followed by etching the upper layer with an etching medium which selectively etches the upper layer, then etching the lower layer underneath the upper layer with an etching medium which selectively etches the lower layer until the side-etching of a width corresponding to the thickness of the upper layer occurs and furthermore, isotropically etching the upper layer with the etching medium for the upper layer.

According to the present invention, since one step of patterning the mask is followed by a plurality of etching steps, the etching of the layers are carried out in the order of from the upper layer toward the lower layer and, thereafter, from the lower layer toward the upper layer with a selectively etching material, namely, having an etching effect on only a specific layer, the under-etched portion can be removed at the time of the etching from the lower layer toward the upper layer. In addition, since the selectively etching material is used, a wiring film, resistor film or insulating film of a multilayer structure can be processed in a desired form by one mask-patterning step and thus the multilayer wiring board can be fabricated for a shorter time.

Furthermore, in the case of processing the layers in the reversely tapered form, the upper layer is firstly etched and then the lower layer is etched, in which side-etching of a width corresponding to the thickness of the upper layer is effected and, therefore, at this stage the lower layer is in an under-etched state against the upper layer, in other words, the upper layer is in the form of an eaves or visor. A mask material is present on the eaves-shaped upper layer. On the other hand, there is nothing on the side face and underside of the upper layer owing to the above-mentioned etching of the upper and the lower layers. That is, the material of the upper layer is exposed. Accordingly, when this eaves-shaped upper layer is subjected to the isotropic etching with an etching medium which selectively etches the upper layer, the side face and the underside of the upper layer are etched and, as a result, the upper layer can be formed in the reversely tapered form.

Furthermore, the above-mentioned combined methods of processing in the stepped form and of processing in the reversely tapered form are combined can obtain the desired multilayer wiring board with a reduced number of steps.

BRIEF DESCRIPTION OF THE DRAWINGS

FIG. 1 is a sectional view of a multilayer wiring board on which a thin film resistor element made by one example of the present invention was mounted.

FIGS. 2a, 2b, 2c, 2d and 2e are cross-sectional views of the board at the respective steps in the course of manufacture of the multilayer wiring board shown in FIG. 1.

FIG. 3 is a cross-sectional view which explains another structure of a multilayer wiring board made by one example of the present invention.

FIGS. 4a, 4b, 4c, 4d, 4e and 4f are sectional views of the board at the respective steps in the course of manufacture of the multilayer wiring board shown in FIG. 3.

DESCRIPTION OF THE PREFERRED EMBODIMENTS

One example of the method for the manufacture of multilayer wiring board according to the present invention will be explained in detail below referring to the drawings.

FIG. 1 shows a multilayer wiring board made according to one example of the present invention. This multilayer wiring board has such a construction that an insulating film 2 is formed on substrate 1 and furthermore on this insulating film 2 are successively formed resistor film 3, resistor electrode film 4 and wiring electrode film 5, and the wiring electrode film 5 is electrically connected to the conductor packed in the through-holes 6 (6a, 6b, 6c) of the substrate 1.

On the multilayer wiring board shown in FIG. 1 is formed a thin film resistor element (the thin film resistor element is constituted in the form of a doughnut with the through-hole 6b as the center on the substrate and 31a and 31b which are sections appear in FIG. 1).

The thin film resistor element is connected to the resistor electrode film 4 on the center area of the doughnut and is further connected to the through-hole 6b provided in the substrate 1 through the wiring electrode film 5. The thin film resistor element is connected to the resistor electrode film 4 at the end of the outer side of the doughnut and is further connected to the through-hole 6c provided in the substrate 1 or the other part of the upper layer (not shown in FIG. 1) through the wiring electrode film 5.

In such a board, it is necessary to process the side face in the form of a step as shown in the portion enclosed with a circle of broken line in FIG. 1.

One example of the method for making a multilayer wiring board by which the side face can be processed in the form of a step according to the present invention will be explained referring to FIGS. 2a, 2b, 2c, 2d and 2e.

(1) First, as shown in FIG. 2a, an insulating film 2 is formed on the substrate 1 having through-holes filled with a conductor for electric connection to the back side. Then, the resistor film 3 comprising Cr—SiO$_2$ and the resistor electrode film 4 comprising Al film are successively formed by a sputtering method at a thickness of 0.3 µm and 0.4 µm, respectively.

(2) Then, mask 9 is patterned on the Al film. Specifically, as shown in FIG. 2b, the patterning is performed so that the mask 9 does not exist at the portion 7 where a through-hole is to be formed in the insulating film 2 and at the portion 8 where the resistor electrode 4 is to be separated from the wiring electrode 5.

(3) Then, the substrate 1 after the mask has been patterned as in the above (2) is subjected to etching. The etching is carried out successively, namely, first the resistor electrode film 4 is etched and then the resistor film 3 is etched. In this etching, two different etching solutions are used which can selectively etch Al of the resistor electrode film 4 and Cr—SiO$_2$ of the resistor film 3.

For etching the resistor electrode film 4, an etching solution having the composition of phosphoric acid:acetic acid:nitric acid:water=72:10:2:16 is used as an etching material. For etching the resistor film 3, an etching solution having the composition of hydrofluoric acid:ammonium fluoride:hydrochloric acid:phosphoric acid=3:2:2:1 is used as an etching material. These etchings are carried out at room temperature for 15 seconds in a dipping tank. Thus, the under-etched portion 15 of about 5–10 µm is formed in the resistor film 3 under the resistor electrode film 4 as shown in FIG. 2c.

(4) Next, with leaving the patterned mask 9 such as photoresist used for the etching shown in FIG. 2c, etching is carried out with the etching solution used for etching of the resistor electrode film 4 which has selectivity, namely, does not etch the resistor film 3. Thereafter, further etching is carried out using the etching solution for the resistor electrode film 4 for 2 minutes at a solution temperature of 50° C. by a spray type etching apparatus, whereby the resistor electrode film 4 can have a side face of the etched pattern which is set back by about 1–2 µm from the side face of the etched pattern of the resistor film 3 as shown in FIG. 2d. As a result, a multilayer structure in which the resistor film 3 and the resistor electrode film 4 form a step can be obtained.

(5) Thereafter, in order to form via-holes at the positions in the insulating film 2 which correspond to the positions of the through-holes 6, the mask 9 is removed and a mask for etching of the insulating film 2 is patterned and the insulating film 2 is subjected to etching to form via-holes above the through-holes of substrate 1. Furthermore, thereon is formed a wiring electrode film 5 by sputtering or the like. Thereby, a multilayer wiring board having the sectional structure as shown in FIG. 2e can be obtained. The process of this step is a known process.

According to the above example of the present invention, the side face of the etched resistor electrode film 4 and that of the resistor film 3 can be easily formed in the stepped form. As a result, the wiring electrode film 5 can be formed with a good coverage on the side faces of the resistor electrode film 4 and the resistor film 3 by sputtering or the like and a multilayer wiring board of high reliability can be manufactured.

Next, another structure of the multilayer wiring board made by one example of the present invention will be explained referring to FIG. 3.

The multilayer wiring board shown in FIG. 3 is constructed by forming a multilayer metal wiring 12 comprising Cr film 12a and Al film 12b and a dummy wiring 14 on the glass substrate 11 and forming thereon an organic insulating film 13.

This multilayer wiring board is characterized in that the side faces of the upper Al film 12b which constitutes the multilayer wirings 12 and 14 form a reversely tapered shape in a cross sectional view and adhesion of the organic insulating film 13 can be improved even when adhesion of the organic insulating film 13 to the wirings 12 and 14 or to the substrate 11 is insufficient. The method for making the multilayer wiring board will be explained in detail below.

(1) As shown in FIG. 4a, a Cr film 12a of 0.3 µm and an Al film 12b of 2 µm are formed on the glass substrate 11 by sputtering or the like.

(2) Then, mask 16 is patterned on the Al film. Specifically, the mask is patterned so that the mask material is present at the position where the metal wiring 12 or the dummy wiring 14 is to be formed on the glass substrate 11.

(3) Then, the metal wiring 12 and the dummy wiring 14 which are required as electric circuits are formed by photoetching. For this etching, there are prepared different kinds of etching solutions which can perform selective etching for the Cr film 12a and the Al film 12b, respectively. First, the upper Al layer 12b is etched with, for example, an etching solution having the composition of phosphoric acid:acetic acid: nitric acid:water=15:3:1:1. As a result, the structure of FIG. 4c is obtained.

(4) Then, the Cr film 12a is etched with, for example, an aqueous ammonium ceric nitrate solution so that a side-etching (under-etching) of a width corresponding to the thickness of the Al film 12b (the portion d in FIG. 4d) occurs. In FIG. 4d, a side-etching of a length l (=d) is shown.

(5) Subsequently, the Al film 12b is subjected to isotropic etching with the above-mentioned etching solution. Since this isotropic etching is carried out after the side-etching (under-etching) of the above step (4), the etching solution can be allowed to get into the underneath of the Al film 12b from the side face of the Cr film 12a. Therefore, etching of the Al film 12b is carried out from the two directions, namely, from the side face and the underneath of the Al film 12b. Since this etching is carried out isotropically, the Al film 12b has a reversely tapered structure where the contact area of the Al film 12b with the upper layer is large and the contact area of the Al film 12b with the lower layer is small. In this example, the Al film 12b in the reversely tapered form about 2 μm in radius can be obtained (FIG. 4e).

(6) The mask 16 is removed and then, PIQ (a polyimide resin) is coated and baked to form organic insulating film 13.

Thus, the multilayer wiring board as shown in FIG. 3 can be manufactured through a smaller number of steps. The PIQ as the organic insulating film 13 in multilayer wiring boards is inferior in adhesion to the glass substrate 11 and hitherto, improvement of the adhesion has been made by the treatment with a chelate agent or the like. According to the multilayer wiring board of the present invention shown in FIG. 3, anchoring effect is exhibited by the pattern of the wiring layer in the form of reverse taper, whereby improvement of adhesion can be attained.

In the aforementioned example of the present invention, metal films of two layers are subjected to etching, but the present invention can also be applied to metal films of more layers including a resistor film and a conductive wiring film.

In this case, etching solutions having selectivity for the respective metal layers are used. First, the etching treatment of the layers is successively carried out from the upper layer toward the lower layer and after completion of the etching of the bottom layer, etching treatment of the layers is again carried out from the metal layer present on and contiguous to the bottom layer toward the top layer.

Furthermore, the method of the present invention above can also be utilized for formation of through-holes in an insulating film comprising a laminate of a plurality of different insulators. This formation can also be carried out with etching materials which can selectively etch the respective insulators.

As explained above, according to the present invention, in manufacture of a multilayer wiring board, the wiring layer and insulating layer of multilayer structure can be processed in the desired shape in respect to its side face, for example, in the shape of a step or a reverse taper by formation of mask only one time and with a small number of steps, and coverage of other layer formed thereon can be improved. Thus, multilayer wiring boards of high reliability can be manufactured.

What is claimed is:

1. A method for manufacture of a multilayer wiring board comprising a substrate and two of more patterned material layers provided on the substrate, which includes the following steps:

(a) laminating two or more material layers on a substrate, (b) forming a mask on the laminated layers, (c) Etching the respective layers successively from the top layer toward the bottom layer, (d) etching the layers successively from the second layer form the bottom layer toward the top layer, and (e) removing the mask wherein a specific material layer in the material layers is processed in the reversely tapered form by carrying out the etching of the material layer underneath the specific material layer in the step (a) so that under-etching occurs in the underneath layer and carrying out isotropic etching of the specific material layer in the step (d).

2. A method according to claim 1, wherein etching materials having selectivity for the respective material layers are used for carrying out the etching.

* * * * *